United States Patent
Lombardo et al.

(10) Patent No.: US 6,624,017 B1
(45) Date of Patent: Sep. 23, 2003

(54) MANUFACTURING PROCESS OF A GERMANIUM IMPLANTED HBT BIPOLAR TRANSISTOR

(75) Inventors: Salvatore Lombardo, Catania (IT); Maria Concetta Nicotra, Catania (IT); Angelo Pinto, Augusta (IT)

(73) Assignees: STMicroelectronics S.r.l., Agrate Brianza (IT); Consorzio Per La Ricerca Sulla Microelettronica Nel Mezzogiorno, Catania (IT)

( * ) Notice: Subject to any disclaimer, the term of this patent is extended or adjusted under 35 U.S.C. 154(b) by 101 days.

(21) Appl. No.: 09/724,563

(22) Filed: Nov. 27, 2000

Related U.S. Application Data

(63) Continuation of application No. 09/087,398, filed on May 29, 1998.

(30) Foreign Application Priority Data

May 30, 1997 (EP) .............................................. 97830259

(51) Int. Cl.⁷ ......................................... H01L 21/8249
(52) U.S. Cl. ...................... 438/235; 438/312; 438/315
(58) Field of Search ................................. 438/312, 315, 438/320, 321, 235, 236

(56) References Cited

U.S. PATENT DOCUMENTS

| | | | |
|---|---|---|---|
| 4,343,080 A | 8/1982 | Hataishi et al. ................ 29/571 |
| 5,028,557 A | 7/1991 | Tsai et al. ...................... 437/59 |
| 5,126,278 A | 6/1992 | Kodaira ......................... 437/24 |
| 5,635,423 A | 6/1997 | Huang et al. ................ 437/195 |
| 5,643,825 A | * 7/1997 | Gardner et al. |
| 5,659,201 A | 8/1997 | Wolleson ..................... 257/758 |
| 5,712,177 A | 1/1998 | Kaushik et al. .............. 437/42 |
| 5,753,967 A | 5/1998 | Lin ............................ 257/635 |
| 5,814,555 A | * 9/1998 | Bandyopadhyay et al. . 438/619 |
| 5,821,149 A | * 10/1998 | Schuppen et al. ........... 438/312 |
| 5,847,460 A | 12/1998 | Liou et al. ................... 257/751 |
| 5,960,297 A | * 9/1999 | Saki ............................ 438/424 |

FOREIGN PATENT DOCUMENTS

| | | |
|---|---|---|
| EP | 0697716 A2 | 2/1996 |
| JP | 03-292740 | 12/1991 |

OTHER PUBLICATIONS

S. Wolf et al., "Silicon Processing for the VLSI Era V1"— *Process Technology*, 1986, pp 182–183.

(List continued on next page.)

*Primary Examiner*—Olik Chaudhuri
*Assistant Examiner*—Khiem Nguyen
(74) *Attorney, Agent, or Firm*—Lisa K. Jorgenson; Robert Iannucci; Seed IP Law Group, PLLC

(57) ABSTRACT

A process fabricates a vertical structure high carrier mobility transistor on a substrate of crystalline silicon doped with impurities of the N type, the transistor having a collector region located at a lower portion of the substrate. The process includes: defining a window in the semiconductor substrate; providing a first implantation of germanium atoms through said window; providing a second implantation of acceptor dopants through said window to define a base region; applying an RTA treatment, or treatment in an oven, to re-construct the crystal lattice within the semiconductor substrate comprising a silicon/germanium alloy; forming a first thin dielectric layer of silicon dioxide by chemical vapor deposition; depositing a second dielectric layer onto said first dielectric layer; depositing a polysilicon layer onto said second dielectric layer; etching away, within the window region, said first and second dielectric layers, and the polysilicon layer, to expose the base region and form isolation spacers at the window edges; and forming an N-doped emitter in the base and window regions. This fabrication process is specially attentive to the formation of the silicon dioxide $SiO_2/Ge_xSi_{1-x}$ interface present in vertical structure HBT transistors, if isolation spacers are to be formed. The fabrication process allows the frequency field of application of HBT transistors to be further extended, while eliminating deviations of the base currents from the ideal.

19 Claims, 17 Drawing Sheets

OTHER PUBLICATIONS

Gomi et al., "A Sub–30psec Si Bipolar LSI Technology," in International Electron Devices Meeting, San Francisco, Dec. 11–14, 1988, *Institute of Electrical and Electronics Engineers,* No. 1988, pp 744–747, 1988.

Lombardo, S. et al., "Ge Ion Implantation in Si for the Fabrication of Si/Ge Si Heterojunction Transistors," *Materials Chemistry and Physics, 46*(2–3), pp. 156–160, 1996.

* cited by examiner

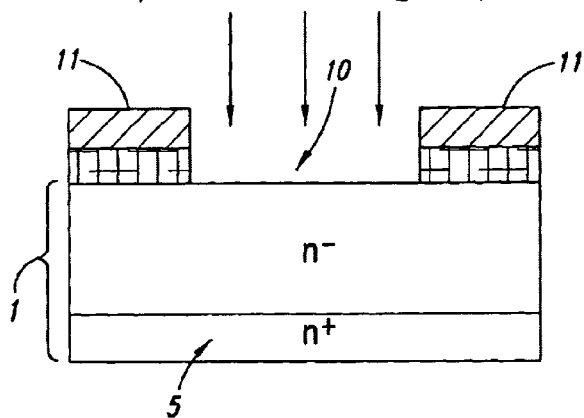
FIG. 3A
*(Prior Art)*
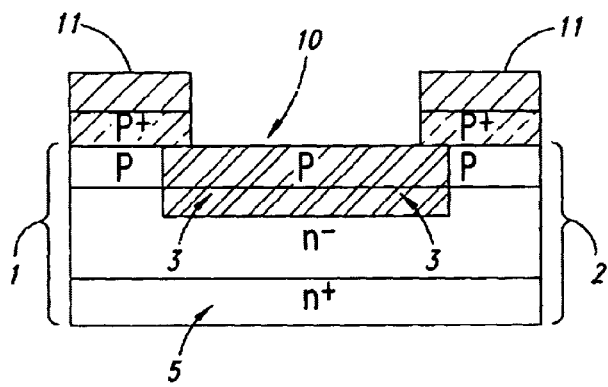
FIG. 3B
*(Prior Art)*
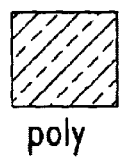 poly    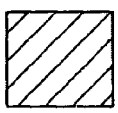 oxide    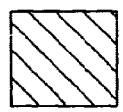 nitride    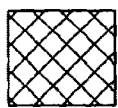 metal
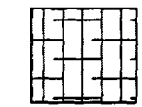 B or $BF_2$ implanted poly    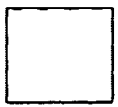 Si    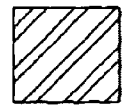 $Ge_xSi_{1-x}$

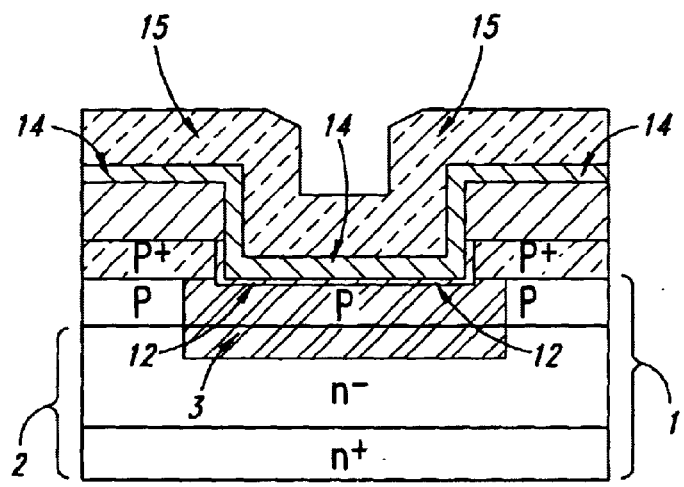
*FIG. 3C*
*(Prior Art)*
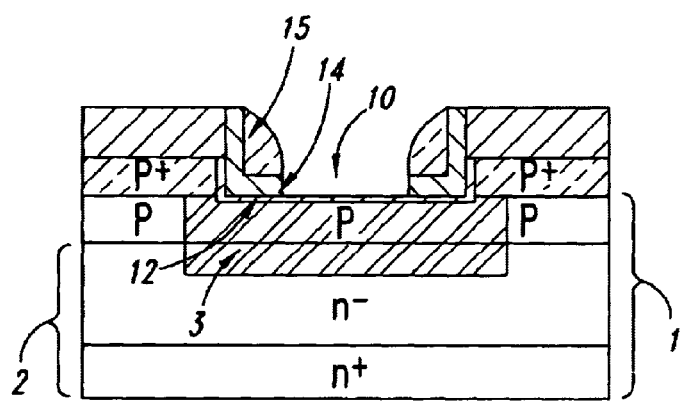
*FIG. 3D*
*(Prior Art)*
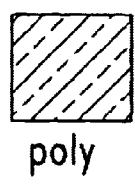 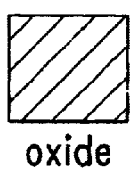  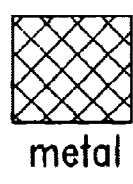
poly    oxide    nitride    metal
 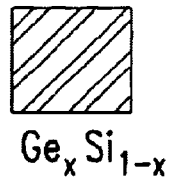
Si    $Ge_xSi_{1-x}$

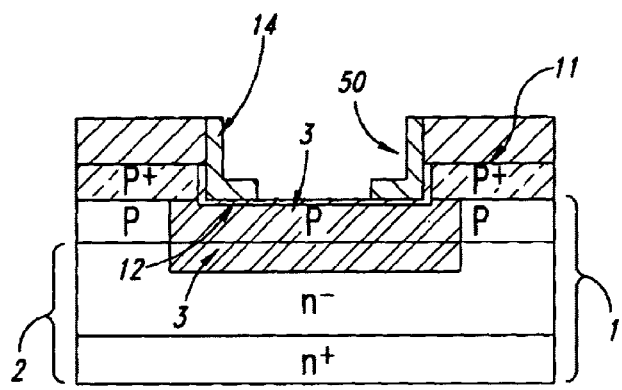
*FIG. 3E*
*(Prior Art)*
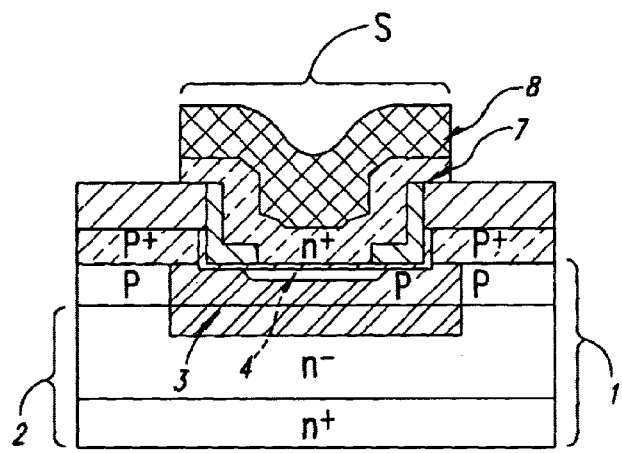
*FIG. 3F*
*(Prior Art)*
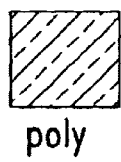 poly
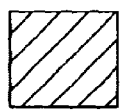 oxide
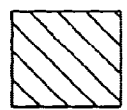 nitride
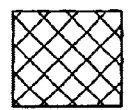 metal
 Si
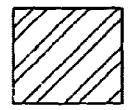 $Ge_xSi_{1-x}$ poly

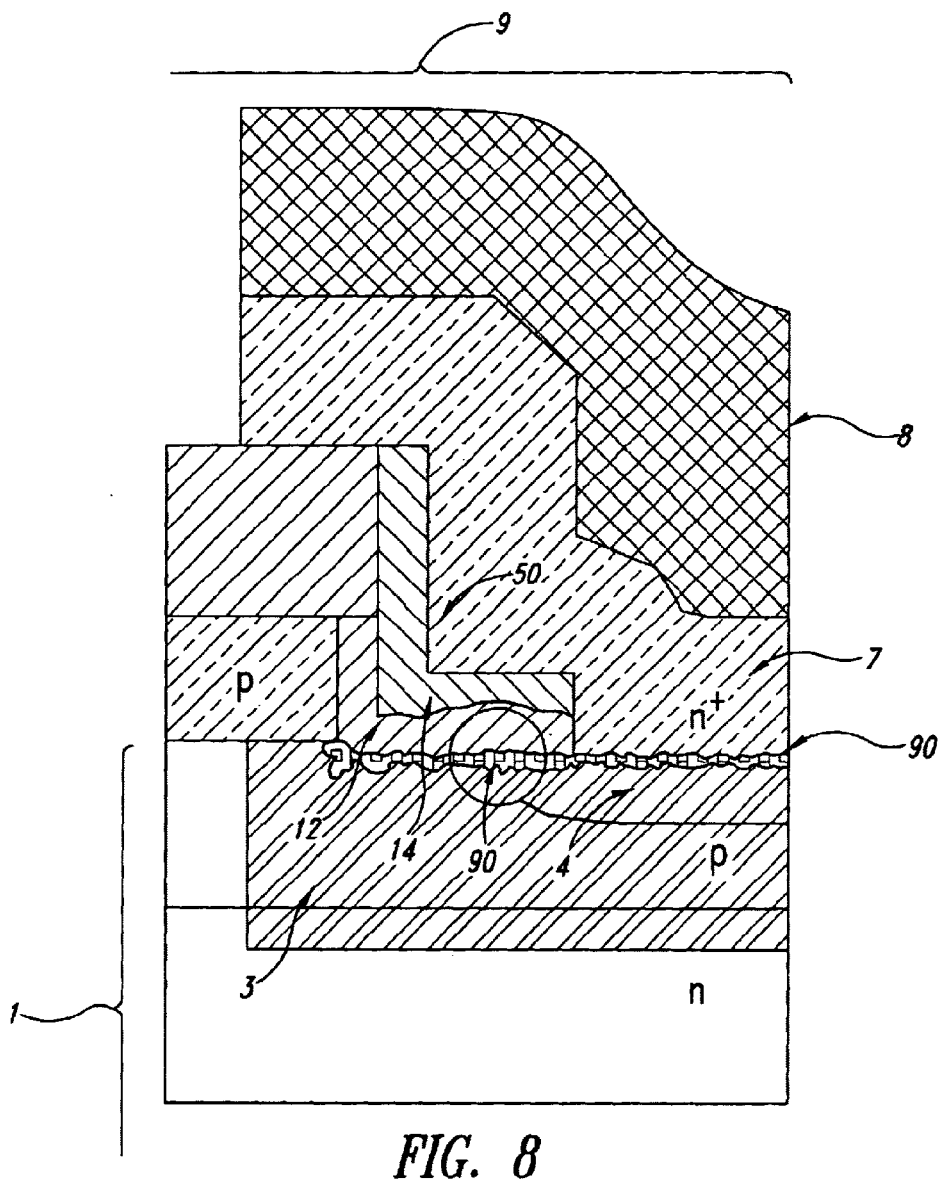
FIG. 8
| 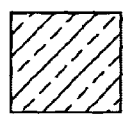 | 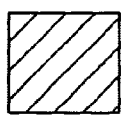 | 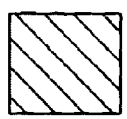 | 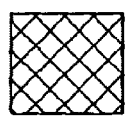 |
|---|---|---|---|
| poly | oxide | nitride | metal |
| 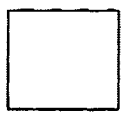 | 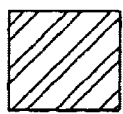 | 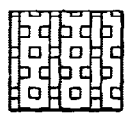 |
|---|---|---|
| Si | $Ge_xSi_{1-x}$ | Ge |

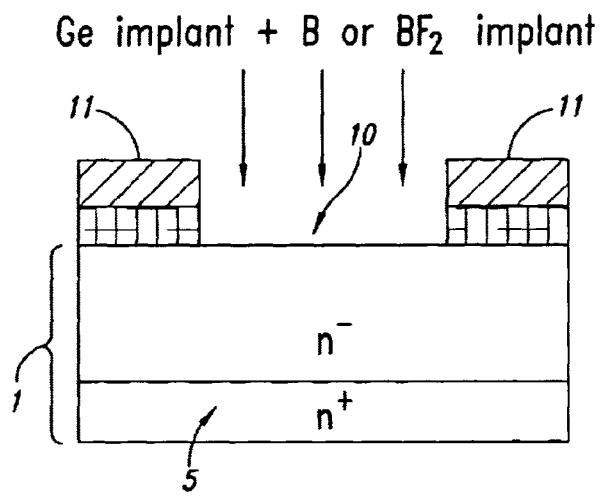
*FIG. 9A*
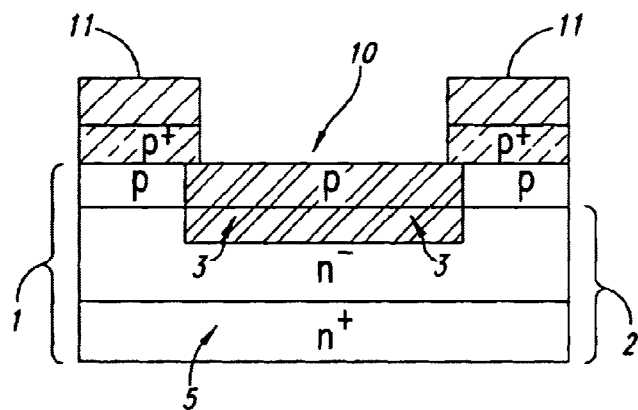
*FIG. 9B*
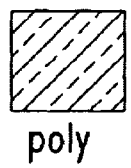 poly
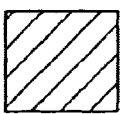 oxide
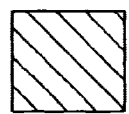 nitride
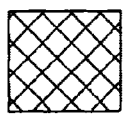 metal
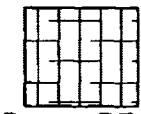
B or $BF_2$ implanted poly
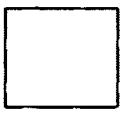 Si
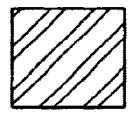 $Ge_xSi_{1-x}$

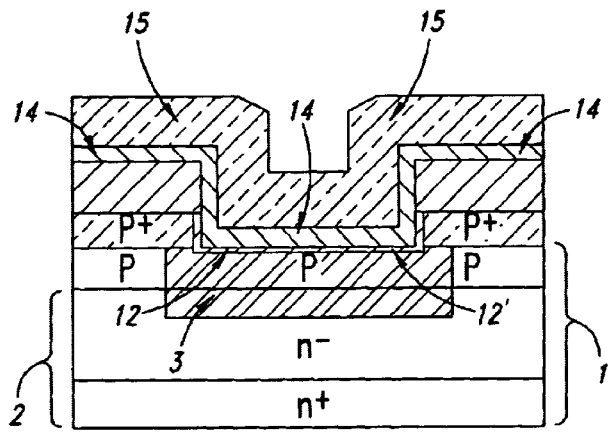
FIG. 9C
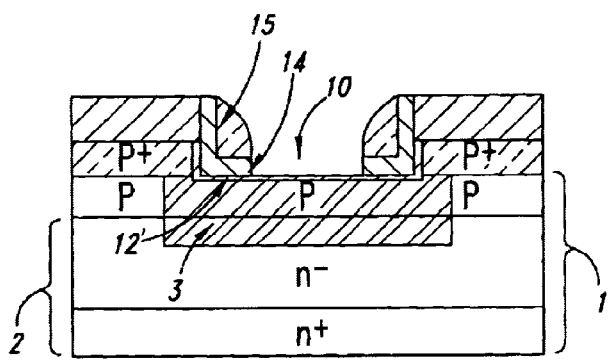
FIG. 9D
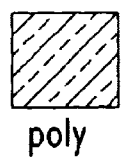 poly
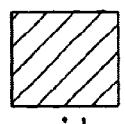 oxide
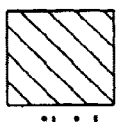 nitride
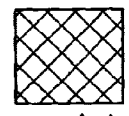 metal
 Si
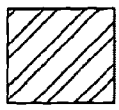 $Ge_xSi_{1-x}$

MANUFACTURING PROCESS OF A GERMANIUM IMPLANTED HBT BIPOLAR TRANSISTOR

This application is a continuation of application Ser. No. 09/087,398 filed May 29, 1998.

TECHNICAL FIELD

This invention relates generally to a process for fabricating a vertical structure high carrier mobility transistor on a crystalline silicon substrate, having a collector region located at a lower portion of the substrate.

The invention relates, particularly but not exclusively, to a process for fabricating a heterostructure bipolar transistor (HBT) for very high frequency applications, and the description to follow is given with reference to this applicational field for convenience of illustration.

BACKGROUND OF THE INVENTION

As skilled persons in the art know well, the application of heterostructures to solid state electronic devices has prompted a vast increase of their working range at very high frequencies.

In particular, this technology has been applied to bipolar transistor devices, to thereby improve both the injection efficiency of the charge carriers and the passage frequency ($f_t$) value, the latter being closely related to the cut-off frequency ($f_T$) of the device.

Heterostructures can be prepared by different methods, of which the MBE (Molecular Beam Epitaxy) method is the best known and provides a structure free of lattice imperfections; other, more expensive methods are sophisticated versions of CVD which, however, have a disadvantage in that their throughput adds to the cost of the silicon die.

Yet this MBE method has only sparsely been applied to large volume industrial processes, on account of it involving lengthy processing steps that command strict control of their physical parameters.

Thus, it has often been more convenient to adopt other methods, such as ion implantation, which could yield similar heterostructures of a fair quality within acceptable times for large volume production lines.

A bipolar transistor implemented with a vertical structure including a $Ge_xSi_{1-x}$ heterostructure between the base and collector regions will now be described in relation to such a field of application.

The HBT bipolar transistor under consideration is illustrated schematically by the enlarged cross-sectional view of FIG. 1.

This HBT transistor has a vertical structure of the NPN type and is formed on a crystalline semiconductor substrate 1 wherein, by successive implantations, a collector region 2 of the N type, a base region 3 of the P type, and an emitter region 4 of the N type have been defined, from the substrate bottom up.

Specifically, it can be seen that the collector region 2 includes a heavily N-doped layer 5 effective to provide a good ohmic contact with a collector metal (not shown because conventional) provided in a lower portion of the substrate 1.

An added feature of the HBT transistor shown in FIG. 1 is an opening provided above the substrate 1 to isolate the base region 3 and later allow formation of a contact region 9 above the emitter region 4.

This contact region 9 comprises a heavily N-doped layer 7 overlaid by a metal layer 8.

Having briefly described the HBT transistor, the $Ge_xSi_{1-x}$ heterostructure formed within the crystalline silicon substrate 1 will now be examined to see what changes are introduced in the energy band curve of the HBT transistor.

This $Ge_xSi_{1-x}$ heterostructure is characterized by the x and 1-x concentrations, respectively associated with the germanium and silicon atoms, varying with the spatial implant depth in the substrate 1.

In FIG. 2, the energy band curve of the bipolar transistor HBT is plotted as a full line for comparison with the band curve of a standard bipolar transistor (BJT), plotted as a broken line.

A comparison of the two band curves of the transistors HBT and BJT shows that the bipolar transistor HBT has an energy level in the conduction band which is always below that of the standard transistor BJT, through the base region to the interface with the collector region.

In particular, it can be seen that for the transistor HBT, when moving from its base region toward its collector region, there occurs a gradual slow decrease of its energy gap ($E_g$) which can be regarded as an effect of spatial modulation of the energy gap. This modulation is obtained by suitable implantation profiles of the germanium (Ge) atomic species whose concentration is maximal at the collector-base interface and minimal or almost nil at the emitter-base interface.

An active zone bias of the bipolar transistor HBT conforming with the above band curve allows of faster injection of the carriers from the emitter region, thereby greatly reducing their passage time.

The net result is a markedly increased cut-off frequency ($f_T$) of the HBT transistor and a decreased proportion of carriers trapped within the base.

Thus, for HBT transistors biased with collector currents in the milliampere range, high cut-off frequency values can be obtained which would not be achievable by conventional bipolar technology.

The $Ge_xSi_{1-x}$ heterostructure provided between the base and collector regions enables the P-doping of the base region to be increased, thereby lowering the value of the intrinsic resistance $R_{bb}$ in the base region that restricts the applications of bipolar transistors at high frequencies.

A previously mentioned method of conventionally forming the HBT transistor with a $Ge_xSi_{1-x}$ heterostructure will now be described with reference, in particular, to FIGS. 3a–3f. The same reference numerals used for similar elements in FIG. 1 have been retained for convenience.

FIG. 3a shows a crystalline silicon substrate 1 which has been doped with impurities of the N type and formed with a window 10 by selective deposition of a protective material 11. This protective material comprises a material layer, including impurities of the P type, which is deposited over the substrate and insulated by a dielectric capping.

A first implantation of germanium (Ge) is carried out through this window 10, and is followed by a second implantation of acceptor impurities, such as boron (B) atoms or $BF_2^+$ ions.

Thereafter, a step of re-construction of the crystal lattice of the substrate is carried out by an RTA (Rapid Thermal Annealing) process, or a conventional thermal process in an oven, which is also applied to aid in driving the implanted ions into sites freed in the crystal lattice.

The outcome of this re-construction step is shown in FIG. 3b, where a planar base region 3, extending at the window 10 to a sufficient depth to allow of the subsequent creation of an emitter region, is highlighted for the first time.

Simultaneously with the formation of the base region 3 in the substrate 1, a collector region 2 is defined which is incorporated to the remaining portion, not implanted with P-type impurities, of the substrate 1.

The base region, extending as far as the interface to the collector region 2, will presently feature a $Ge_xSi_{1-x}$ heterostructure formed during the first implanting step and characterized by an energy band curve of the kind shown in FIG. 2.

From now on, as shown in FIG. 3c, the processing over the substrate 1, at the location of the window 10 and the protective material 11, will see the following successive operations:

thermal growth of a first thin dielectric layer 12 of silicon dioxide ($SiO_2$);

deposition of a second dielectric layer 14, typically of silicon nitride ($Si_3N_4$), onto the first thin dielectric layer 12;

deposition of a polysilicon layer 15.

To provide an emitter region at the location of the window 10 in the substrate 1, the process for fabricating the HBT transistor comprises a first chemio-physical etching (RIE) step and a second etching step, respectively of the polysilicon layer 15 and the second dielectric layer 14, to partially form isolation spacers at the edges of the window 10, as shown in FIG. 3d.

A third wet etching step of the remaining portions of the polysilicon layer 15, and a fourth etching step of the first thin dielectric layer 12 only, bring to completion the formation of the spacers 50, thereby exposing the base region 3 again, as shown in FIG. 3e.

The HBT transistor with $Ge_xSi_{1-x}$ heterostructure can now be completed by conventional processes for the formation of an emitter region 4 accommodated within the base region 3 and overlaid by a corresponding emitter contact 9.

FIG. 3f is a general view of the HBT transistor with $Ge_xSi_{1-x}$ heterostructure being provided with an emitter contact 9 which comprises a first polysilicon layer 7 heavily doped with impurities of the N type and metallized on top by a layer 8.

The HBT transistors with $Ge_xSi_{1-x}$ heterojunction fabricated with the above process have revealed upon testing a behavior of the base current which is less than ideal.

This deviation from the ideal is brought out by the graph of FIG. 4, where the collector and base currents are plotted versus the voltage $V_{be}$ between the base and the emitter, for two different HBT transistors formed on a common substrate.

The HBT transistors (T1,T2) in question have values (At1,At2) of their emitter surface areas of $2\times7.4$ $\mu m^2$ and $0.4\times7.4$ $\mu m^2$, respectively, resulting in a ratio (At1/At2) of five between their emitter areas and a ratio (pt1/pt2) of 1.2 between the outer perimeters of their emitter regions.

On the graph, the curves relating to the transistor T1 are full lines, and those relating to the transistor T2 are broken lines.

It can be seen from the graph that the base currents (those having flatter curves) of T1 and T2 differ little from each other, although the ratio (At1/At2) of their emitter areas is of five.

This brings out the existence of a non-ideal component for the base current which is unaffected by changes in the emitter surface area. This deviation from the ideal, well recognized in the art, has been attributed heretofore to attempts of the $Ge_xSi_{1-x}$ heterostructure, regarded as being responsible for re-combination phenomena within the semiconductor substrate, to relax.

SUMMARY OF THE INVENTION

An embodiment of this invention is directed to a process for fabricating a transistor with $Ge_xSi_{1-x}$ heterostructure, which can overcome the limitations described hereinabove so as to further improve its frequency performance.

The inventors of this invention recognized that the cause for HBT transistors deviating from the ideal is because of surface re-combination phenomena, rather than recombination phenomena reputedly occurring within the $Ge_xSi_{1-x}$ heterostructure.

Such surface re-combination phenomena have been found to occur in the neighborhood of the interface between the crystalline semiconductor substrate, incorporating a HBT transistor, and a thin layer of silicon dioxide ($SiO_2$) grown to aid in the formation of the spacers near an emitter region.

In one embodiment, the process includes the steps of: defining a window in the semiconductor substrate; providing a first implantation of germanium atoms through said window; providing a second implantation of acceptor dopants through said window to define a base region; applying an RTA (Rapid Thermal Annealing) treatment to re-construct the crystal lattice within the semiconductor substrate comprising a silicon/germanium alloy; forming a dielectric layer by chemical vapor deposition; forming spacers at window edges; forming an emitter region in the substrate through the window; and forming an emitter contact region.

The features and advantages of the process according to the invention will be apparent from the following description of an embodiment thereof, given by way of non-limitative example with reference to the accompanying drawings.

BRIEF DESCRIPTION OF THE DRAWINGS

FIGS. 3a–3f illustrate conventional process steps yielding the high-mobility NPN transistor shown schematically in FIG. 1.

FIG. 8 illustrates a similar situation to that of FIG. 7, but relating to a practical instance of a high carrier mobility transistor also having an $SiO_2/Ge_xSi_{1-x}$ interface.

FIGS. 9a–9f illustrate the process steps according to this invention that yield a high-mobility NPN transistor similar to that shown schematically in FIG. 1.

FIG. 10 is a photograph taken by Atomic Force Microscopy (AFM), which shows an $SiO_2/Ge_xSi_{1-x}$ interface obtained with the fabrication process of this invention.

DETAILED DESCRIPTION OF THE INVENTION

The inventors of the present invention have spotted the main cause of performance deviations from an ideal device which limit, for example, the performance of a high-mobility HBT transistor, in the surface re-combination phenomena that appear at the silicon dioxide-to-germanium/silicon heterostructure, $SiO_2/Ge_xSi_{1-x}$.

In order to provide experimental evidence of the above conclusion, the inventors have conducted a series of atomic force microscopy (AFM) analyses to photograph the situation at the $SiO_2/Ge_xSi_{1-x}$ interface and has gathered useful elements for evaluation.

Figure 5:
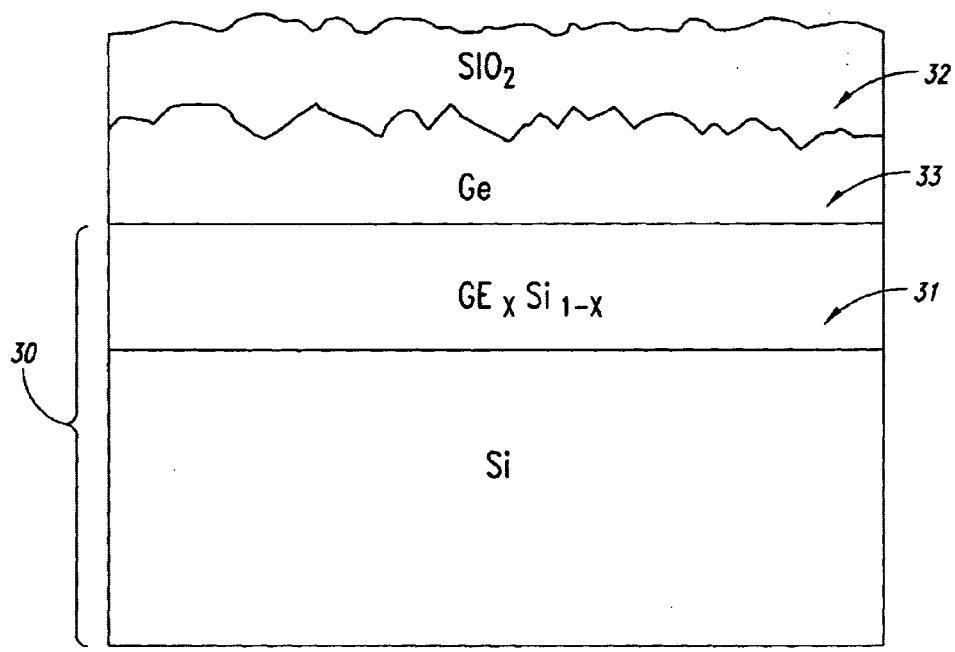
FIG. 5 is an enlarged cross-sectional view of a semiconductor body of crystalline silicon as implanted to provide a $Ge_xSi_{1-x}$ heterostructure, which has been subjected to an oxidation step for growing a silicon dioxide layer thereon.

These analyses have shown a situation of the kind schematically illustrated in FIG. 5, wherein, on a body 30 of crystalline silicon implanted to produce a $Ge_xSi_{1-x}$ heterostructure, a layer 33 of pure germanium develops subsequently to a step of growing a layer 32 of silicon dioxide on the crystalline body 30.

This layer 33 is trapped from beneath by the $Ge_xSi_{1-x}$ heterostructure, and from above, by the silicon dioxide layer 32. This can be explained in theory by that the step of growing the silicon dioxide ($SiO_2$) thermally, as carried out in direct contact with the $Ge_xSi_{1-x}$ heterostructure, causes the silicon (Si) atoms present at its top surface to be depleted upward, thereby promoting the formation of the layer 33 of pure germanium.

In so doing, the silicon dioxide layer 32 develops a surface roughness, due to the underlying germanium layer 33, which is responsible for the surface re-combination phenomena occurring at the $SiO_2/Ge_xSi_{1-x}$ interface.

Figure 6:
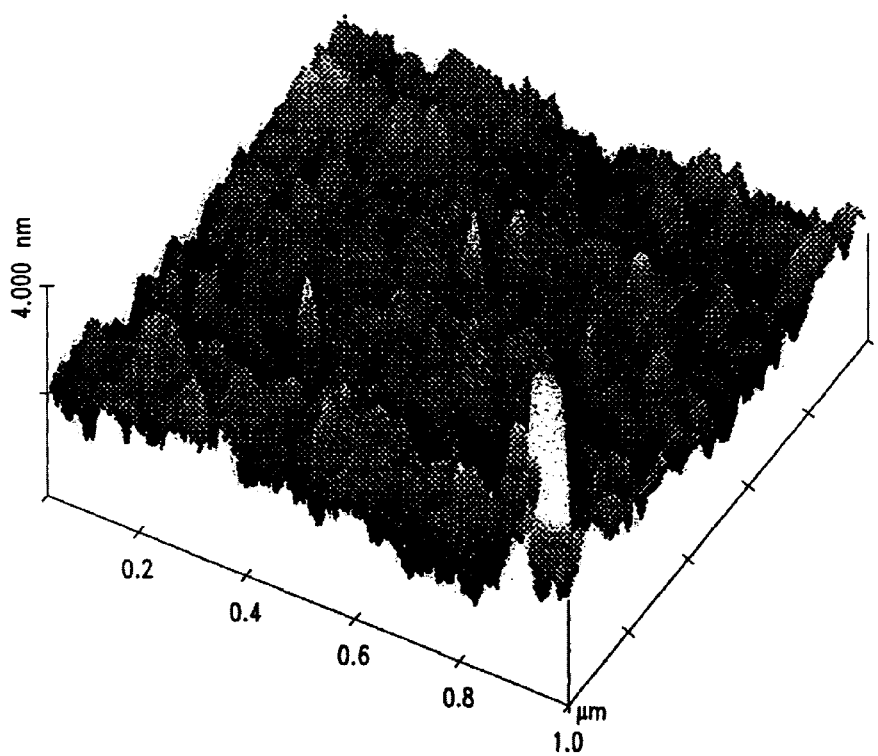
FIG. 6 is a photograph taken by Atomic Force Microscopy (AFM), which shows an $SiO_2/Ge_xSi_{1-x}$ interface of a conventionally made transistor.

This surface roughness is brought out by the atomic force microphotograph of FIG. 6, showing the surface of the silicon dioxide layer 32 after the thermal growth process.

Figure 7:
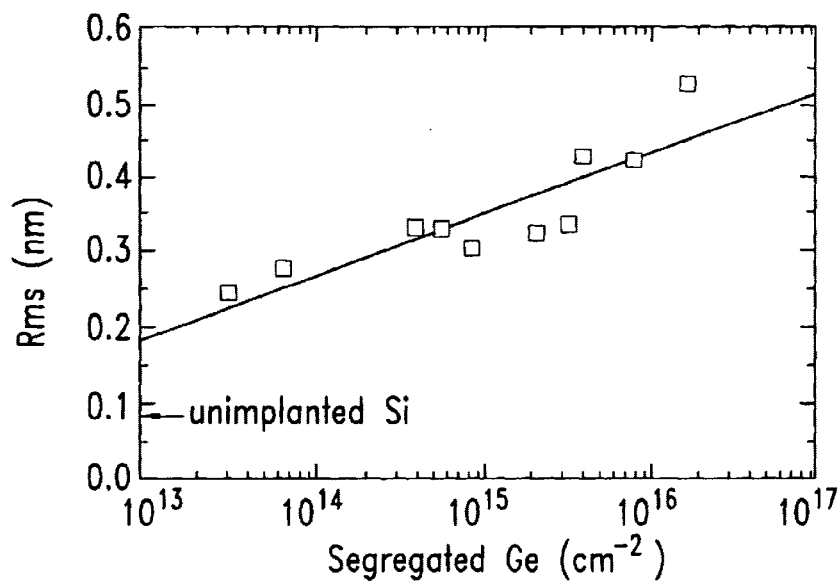
FIG. 7 is a plot illustrating the dependence of surface roughness at an $SiO_2/Ge_xSi_{1-x}$ interface on the amount of germanium segregated in the interface itself.

FIG. 7 is a plot showing the linearly increasing dependence of the amount of segregated germanium in the layer 33 on the surface roughness (Rms) of the layer 32.

A similar situation to the above, for an $SiO_2/Ge_xSi_{1-x}$ interface, is encountered where a high carrier mobility bipolar transistor (HBT) having a vertical structure with a $Ge_xSi_{1-x}$ heterostructure is fabricated by the process steps described under the Background of the Invention heading.

Figure 1:
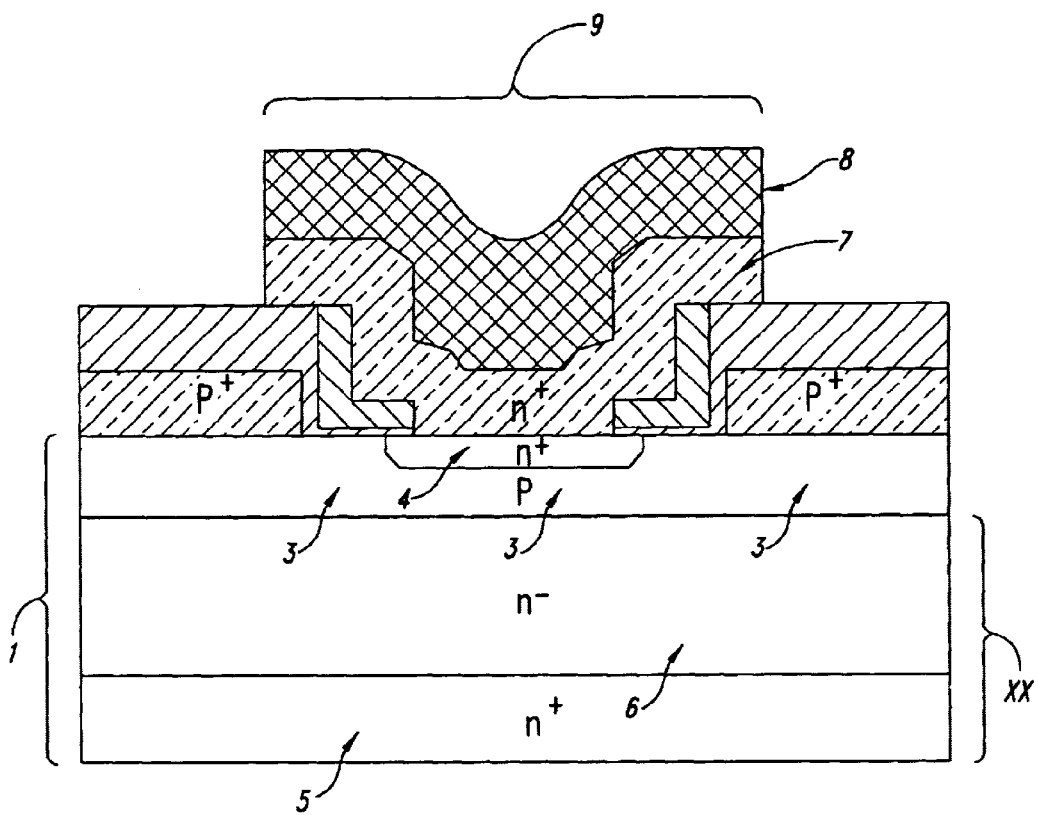
FIG. 1 is an enlarged cross-sectional view of a semiconductor substrate which integrates a high-mobility NPN transistor with a vertical structure including a $Ge_xSi_{1-x}$ heterostructure, according to the prior art.
Figure 1:
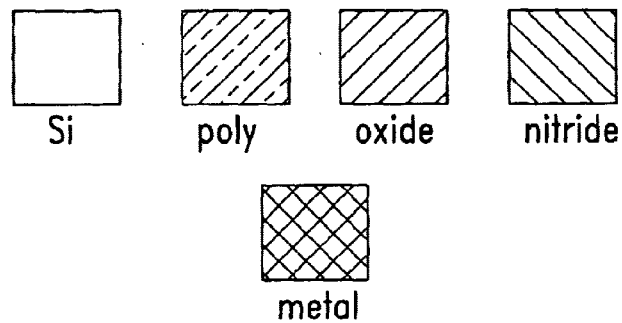

FIG. 8 is a cross-section through the high-mobility transistor of FIG. 1, with enlarged detail views of the emitter 4 and base 3 regions.

This figure highlights that the base and emitter regions are in direct contact with the isolation spacers 50 comprised of a first thin dielectric layer 12 of silicon dioxide and a second dielectric layer 14.

It is to be emphasized, therefore, that a $Ge_xSi_{1-x}$ heterostructure is present within the base region 3 whereover the first thin dielectric layer 12 of silicon dioxide comprising both isolation spacers 50 has been grown.

Accordingly, a narrow region of the $SiO_2/Ge_xSi_{1-x}$ interface has been marked with a heavy circle where the presence is displayed of a layer 90 of segregated germanium resulting from the thermal oxidation process employed for growing the first thin dielectric layer 12.

To overcome the drawbacks connected with the $SiO_2/Ge_xSi_{1-x}$ interface which limit the performance of conventional high-mobility transistors (HBT), a process for fabricating the transistor according to this invention is proposed herein below with reference to FIGS. 9a–9f.

For convenient comparison of the present inventive process with the process described under the Background of the Invention heading, the same reference numerals have been used to denote similar items with those shown in FIGS. 1 and 3a–3f.

FIG. 9a shows a substrate 1 of crystalline silicon (Si), lightly doped with impurities of the N type and having a bottom region 5 which is heavily doped with impurities of the N type. This bottom region 5 corresponds to the ohmic region of a collector contact (not shown here).

A window 10 is formed above the substrate 1 by selective deposition of a protective material 11 over the substrate 1. This protective material 11 comprises a first layer in direct contact with the substrate 1 wherein acceptor impurities are embedded and which is capped by a dielectric material.

A first step of implanting germanium (Ge) is carried out through this window 10, followed by a second step of implanting acceptor impurities, such as boron (B) atoms or BF2+ions.

Thereafter, the crystal lattice of the substrate 1 is re-constructed by an RTA (Rapid Thermal Annealing) process or a conventional treatment in an oven, also is intended to aid in the insertion of the implanted atoms into sites left free in the crystal lattice.

The outcome of the last-mentioned step is shown in FIG. 9b, where a planar base region 3, extending at the window 10 to a sufficient depth in the substrate 1 to allow of the subsequent creation of an emitter region, is highlighted for the first time.

Simultaneously with the definition of the base region 3 in the substrate 1, a collector region 2 is defined which is included in the remaining portion, not implanted with acceptor impurities, of the substrate 1 and, accordingly, also contains the collector ohmic contact region 5.

Figure 2:
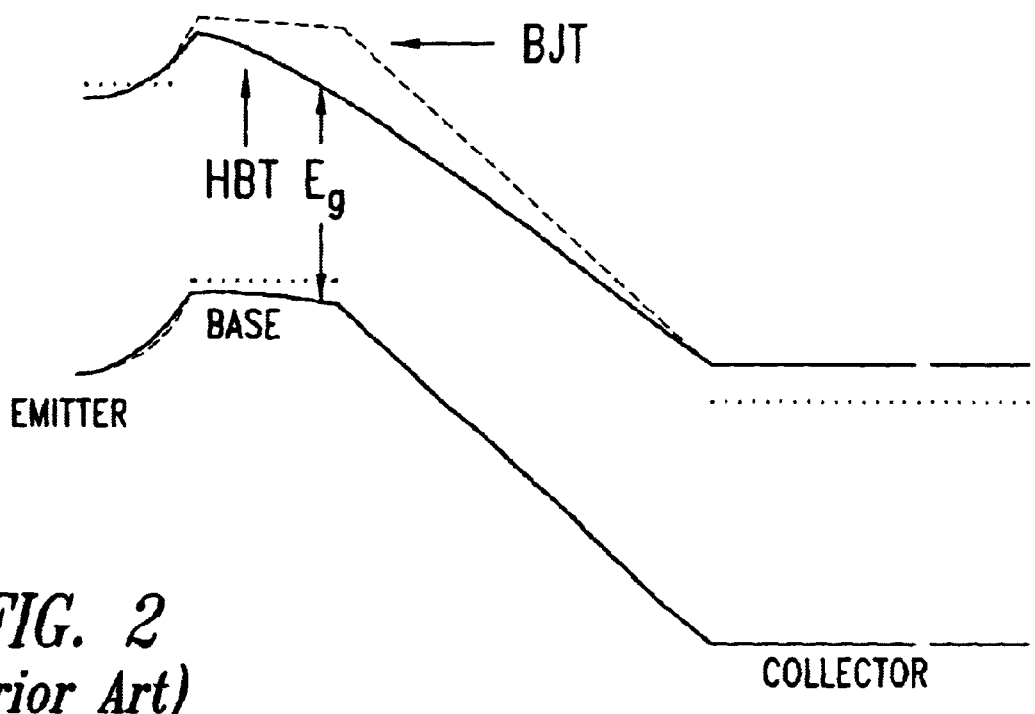
FIG. 2 is an energy band plot typical of a high-mobility NPN transistor.
Figure 4:
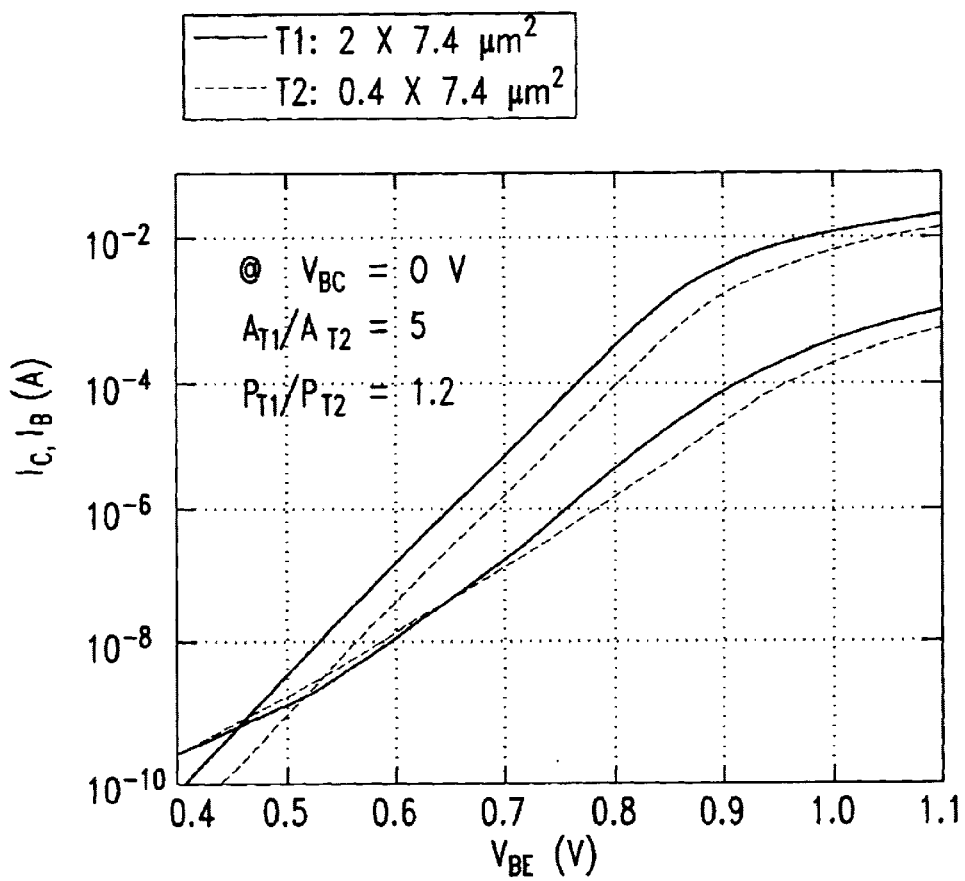
FIG. 4 is a voltage vs. current plot illustrating the behavior of the base and collector currents for two high-mobility NPN transistors T1 and T2 with a $Ge_xSi_{1-x}$ heterostructure having a ratio At1/At2 of 5 of their respective emitter areas.

The base region, extending as far as the interface to the collector region 2, will presently exhibit an energy band curve of the kind shown in FIG. 2 as a result of a $Ge_xSi_{1-x}$ heterostructure having been formed during the first implanting step.

At this stage, as shown in FIG. 9c, at the location of the window 10 and the protective material 11, a first thin dielectric layer 12' of silicon dioxide ($SiO_2$) will be formed over the substrate 1 by chemical vapor deposition (CVD). Other types of CVD, such as PECVD, APCVD, LPCVD, UV-assisted CVD, could also be used.

Unlike the prior art, this thin dielectric layer 12' of silicon dioxide is formed by a CVD process, not by a thermal growth process.

Figure 10:
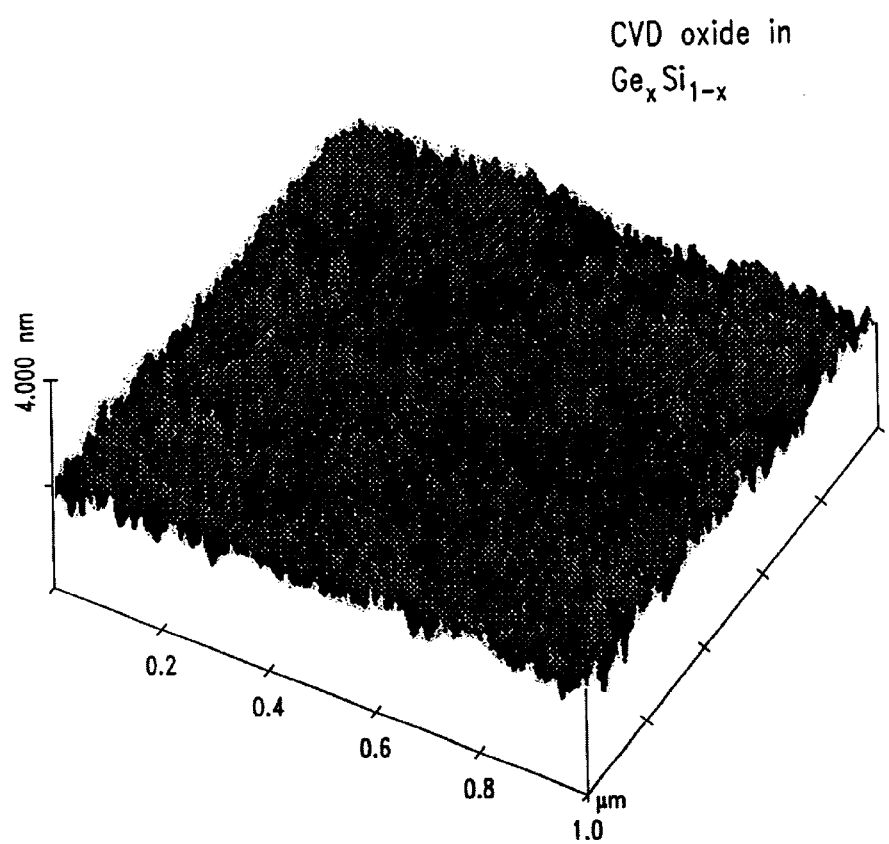
FIG. 10 shows an atomic force microphotograph of the $SiO_2/Ge_xSi_{1-x}$ interface of an HBT transistor of the present invention.

This provides an improved $SiO_2/Ge_xSi_{1-x}$ interface, as can be seen in FIG. 10 which shows an atomic force microphotograph of the $SiO_2/Ge_xSi_{1-x}$ interface thus obtained.

It can be seen that the roughness of the $SiO_2/Ge_xSi_{1-x}$ interface shown in FIG. 10 is significantly less than that in FIG. 6 where the silicon dioxide was grown by thermal oxidation.

Excellent results, as regards to the formation of the $SiO_2/Ge_xSi_{1-x}$ interface, were also obtained by depositing the first thin dielectric layer 12' of silicon dioxide by an atmospheric pressure chemical vapor deposition (APCVD) process.

To further enhance the quality of the interface, and thus reduce the faults originating local surface re-combination phenomena, it is contemplated that a thermal process should follow the deposition of the first thin dielectric layer 12'.

The process for fabricating a HBT transistor according, to an embodiment of the invention is carried on through conventional steps including the deposition of a second dielectric layer 14 on top of said first thin dielectric layer 12', followed by the deposition of a polysilicon layer 15.

In a first alternative embodiment, the second dielectric layer comprises silicon nitride ($Si_3N_4$) to ensure proper adhesion on the underlying dielectric layer 12'.

Finally, to form an emitter region in the substrate 1, at the location of the window 10, a first chemio-physical etching (RIE) step will be carried out on the polysilicon layer 15, and a second etching step on the second dielectric layer 14, to obtain the partial formation of isolation spacers at the edges of the window 10, as shown schematically in FIG. 9d.

Figure 9E:
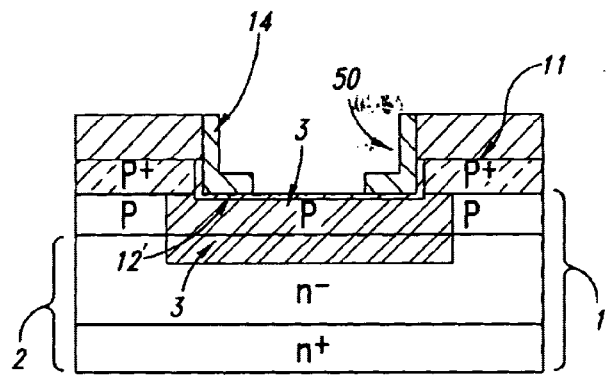

A third, wet etching step carried out on the remaining portions of the polysilicon layer 15 and a fourth etching step carried out on just the first thin dielectric layer 12' will complete the formation of the spacers 50, thereby exposing the base region 3 again, as shown in FIG. 9e.

The HBT transistor formed according to the teachings of this invention can then be completed with conventional processes to form an emitter region 4 within the base region 2.

Finally, the emitter region 4 will be overlaid with a corresponding top emitter contact 9, optimized to enhance the injection efficiency of the HBT transistor.

Figure 9F:
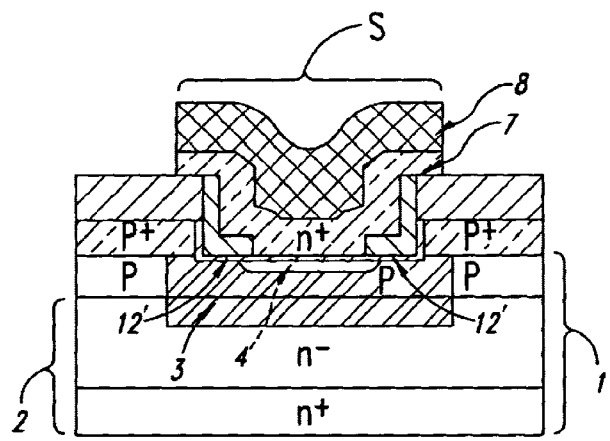

FIG. 9f is a comprehensive view showing the HBT transistor with a $Ge_xSi_{1-x}$ heterojunction and the emitter contact 9 comprising a first polysilicon layer 7, heavily doped with impurities of the N type and capped by a metal layer 8.

A second alternative embodiment of the inventive process for fabricating HBT transistors will now be described and comprises processing steps which are identical with those described above up to the moment of forming the first thin dielectric layer 12' of silicon dioxide.

In this second alternative embodiment, the first thin dielectric layer of silicon dioxide is replaced by a thick dielectric layer of silicon dioxide ($SiO_2$) also deposited by chemical vapor deposition (CVD).

In this embodiment, the thick dielectric layer of silicon dioxide could also be deposited by an APCVD process, followed by an optional thermal process.

The steps of the second alternative embodiment of the fabrication process include: depositing a layer 15 of polysilicon; etching inside the window region; and forming an emitter region overlaid by an electric contact, similar to the first embodiment described.

Also within the principle of this invention, a third alternative embodiment of the HBT transistor fabrication process will now be disclosed which includes the same process steps as those previously described up to the moment of forming the first thin dielectric layer 12'.

In this third alternative embodiment, the first thin dielectric layer 12' is formed by depositing a sacrificial silicon (Si) layer and then subjecting it to thermal oxidation. This sacrificial layer is deposited inside the window region 10 in direct contact with the $Ge_xSi_{1-x}$ heterostructure included in the substrate 1.

Advantageously, the process steps described for forming the first thin dielectric layer 12' by a sacrificial layer will yield the same results, in terms of quality of the $SiO_2/Ge_xSi_{1-x}$ interface, as were obtained previously by forming the layer 12' with a chemical vapor deposition (CVD) process.

It has been found that the sacrificial layer deposited inhibits the formation of the occluded germanium layer between the heterostructure and the first thin dielectric layer 12' because it prevents the oxidation process from reaching the $Ge_xSi_{1-x}$ heterostructure.

In order to further minimize the surface re-combination phenomena that occur at the $SiO_2/Ge_xSi_{1-x}$ interface, the third alternative embodiment of the process may also have the step of forming the thin dielectric layer 12' followed by a suitable thermal treatment.

The steps of the third alternative embodiment of the HBT transistor fabrication process will then include: depositing a second dielectric layer 14; depositing a layer 15 of polysilicon; etching inside the window region; and forming an emitter region overlaid by an electric contact, similar to the first embodiment described.

To improve the adhesion of the second dielectric layer 14 on the first thin dielectric layer 12', the second dielectric layer may comprise silicon nitride ($Si_3N_4$).

Again within the principle of this invention, a fourth alternative embodiment of the HBT transistor fabrication process is provided which includes processing steps identical with those previously described in relation to the third alternative embodiment up to the moment when the first thin dielectric layer 12' is formed.

In this embodiment, the first dielectric layer of silicon dioxide is further grown thermally to provide a dielectric layer of increased thickness embedding, or replacing, the second dielectric layer 14.

In order to minimize the surface re-combination phenomena that occur at the $SiO_2/Ge_xSi_{1-x}$ interface, the fourth alternative embodiment of the HBT transistor fabrication process may also have the oxidation step followed by a suitable thermal treatment.

The next steps of the fourth alternative embodiment of the fabrication process will include: depositing a layer 15 of polysilicon; etching inside the window region; and forming an emitter region overlaid by an electric contact, similar to the second embodiment described.

Advantageously, by adopting the fabrication processes of this invention, the technical problem of the base current deviating from the ideal in HBT transistors can be solved.

Figure 11:
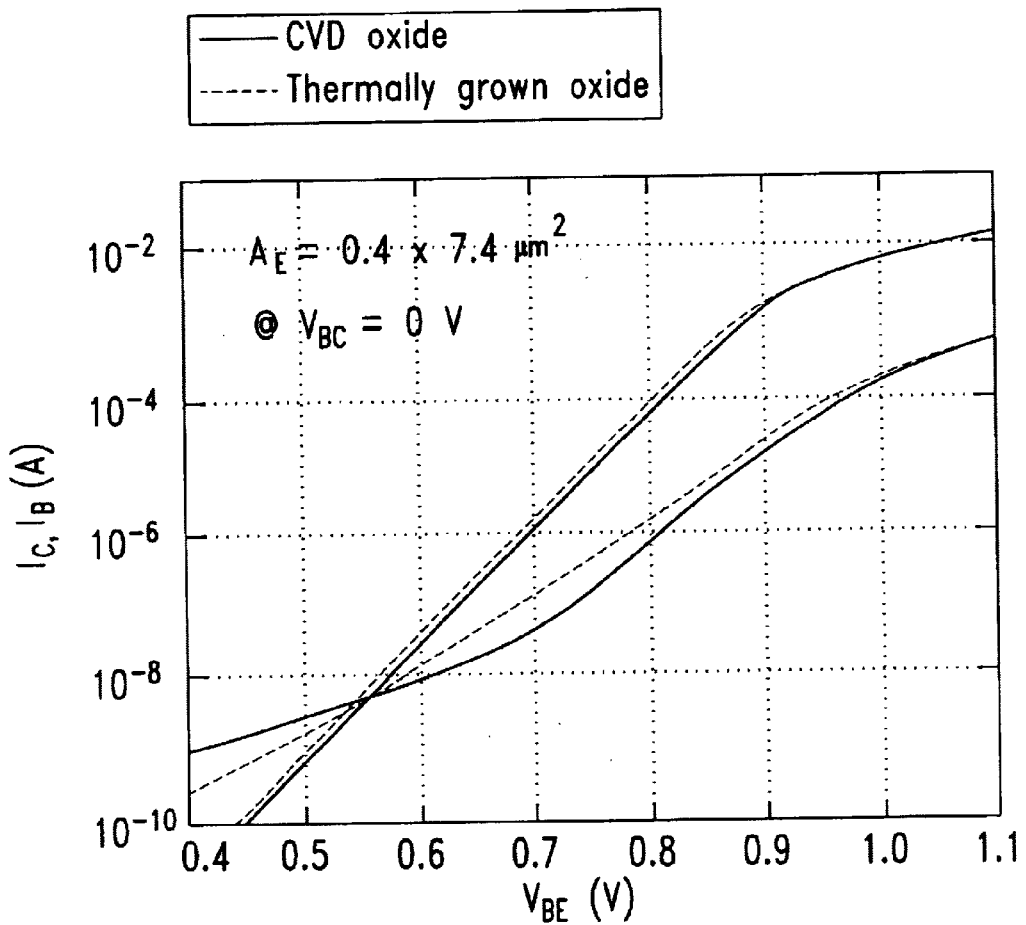
FIG. 11 is a plot showing the behavior of the collector and base currents versus the base-emitter bias voltage, for profiles of acceptor impurities in substrates integrating two different types of HBT transistors.

The truth of this statement is brought out by the graph in FIG. 11 which illustrates the behavior of the collector (Ic) and base (IB) currents versus bias voltage (Vbe), as applied between the base and the emitter, for two HBT transistors having the same emitter surface area but formed with different fabrication methods. In fact, two patterns can be distinguished on this graph: the one (broken line) associated with the HBT transistor which has the dielectric layer 12 grown by thermal oxidation, and the other (full line) associated with the HBT transistor formed by the process of this invention with the dielectric layer 12' deposited by CVD.

These two patterns nearly match each other, and this match reveals a marked reduction in the deviation of the base current from the ideal.

Figure 12:
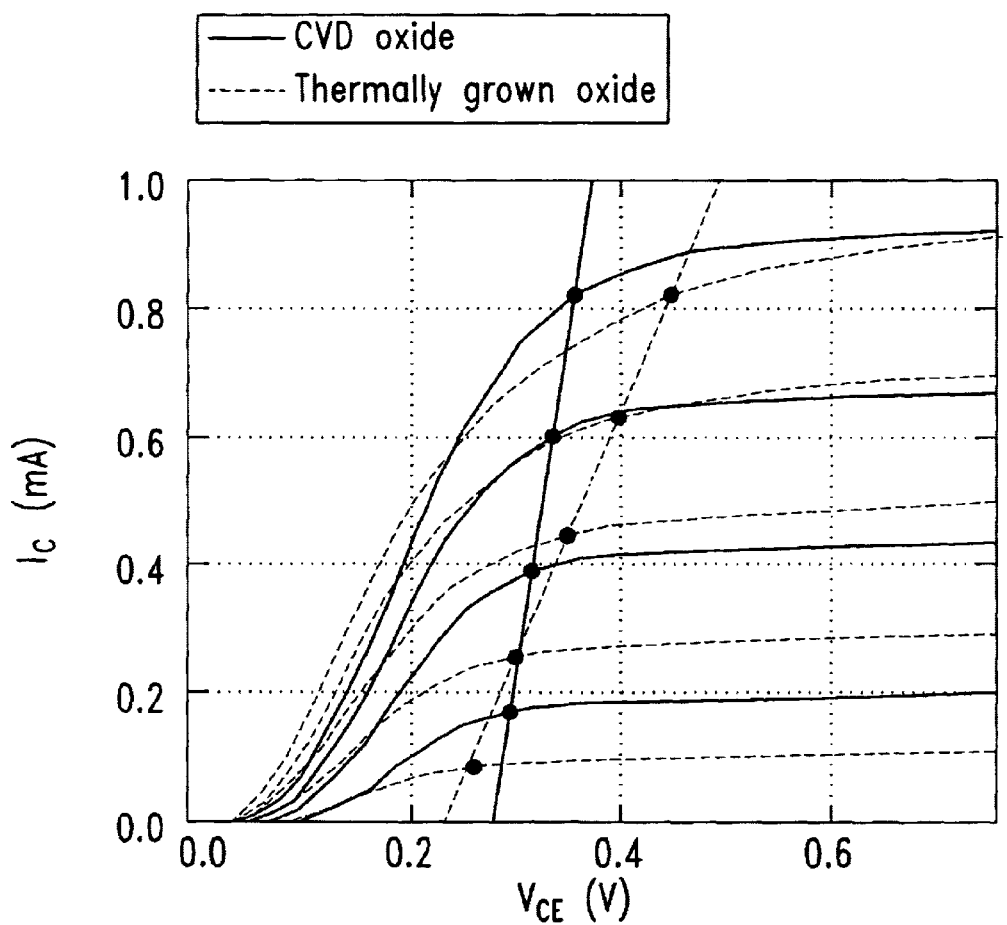
FIG. 12 is a plot of the collector current versus the collector-emitter bias voltage, for two different types of HBT transistors.

FIG. 12 shows, for the same types of HBT transistors as above, the behavior of their respective collector currents (Ic) versus the bias voltage (Vce) across the collector and emitter.

It is evinced from this graph that, for HBT transistors fabricated by the process of the invention (full line curve), a significant increase occurs in the variation percent of the current gain versus the collector current. It should be also emphasized that these transistors have lower saturation voltage values, thereby affording lower power consumption.

Another advantage of the fabrication process of this invention or its first embodiment (CVD deposition of the layer 12') is that it involves relatively low deposition temperatures. This prevents back diffusion of the implanted acceptor impurities, thereby avoiding an oxidation-enhanced diffusion of boron and further raising the cut-off frequency of the HBT transistor fabricated by the process of this invention.

Figure 13:
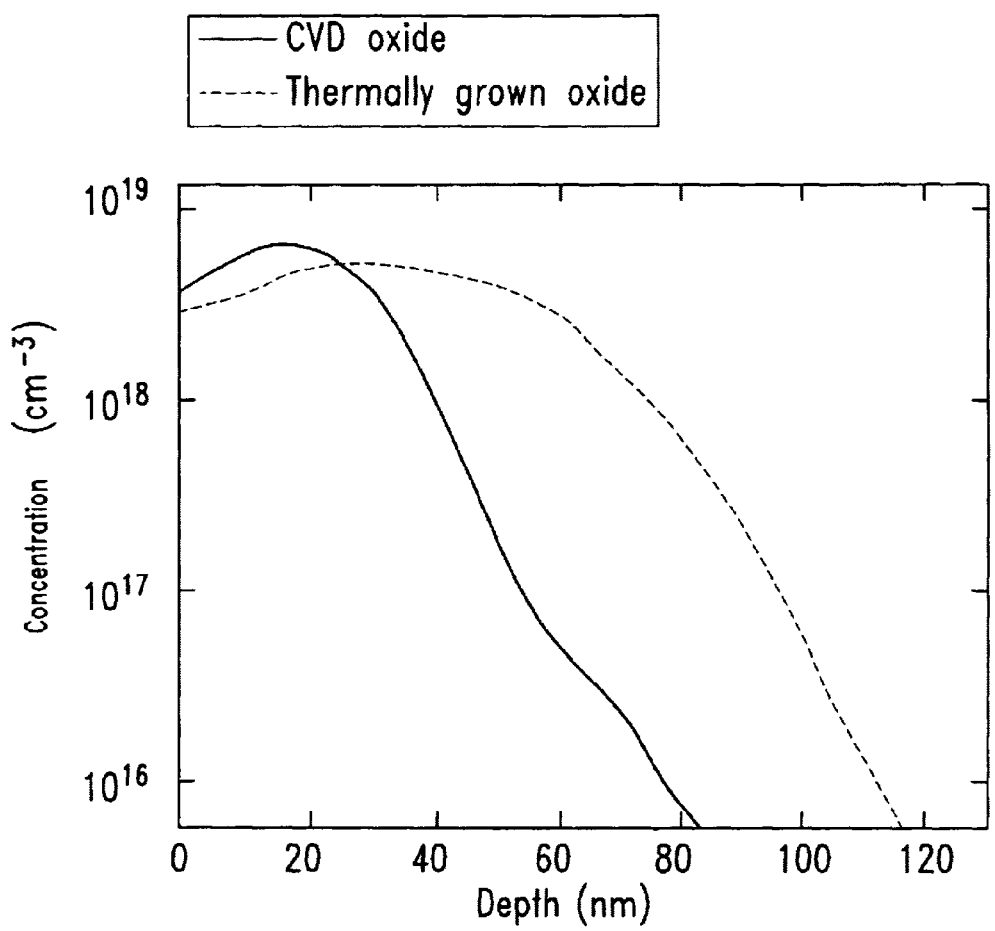
FIG. 13 is a plot of the concentration
Figure 14:
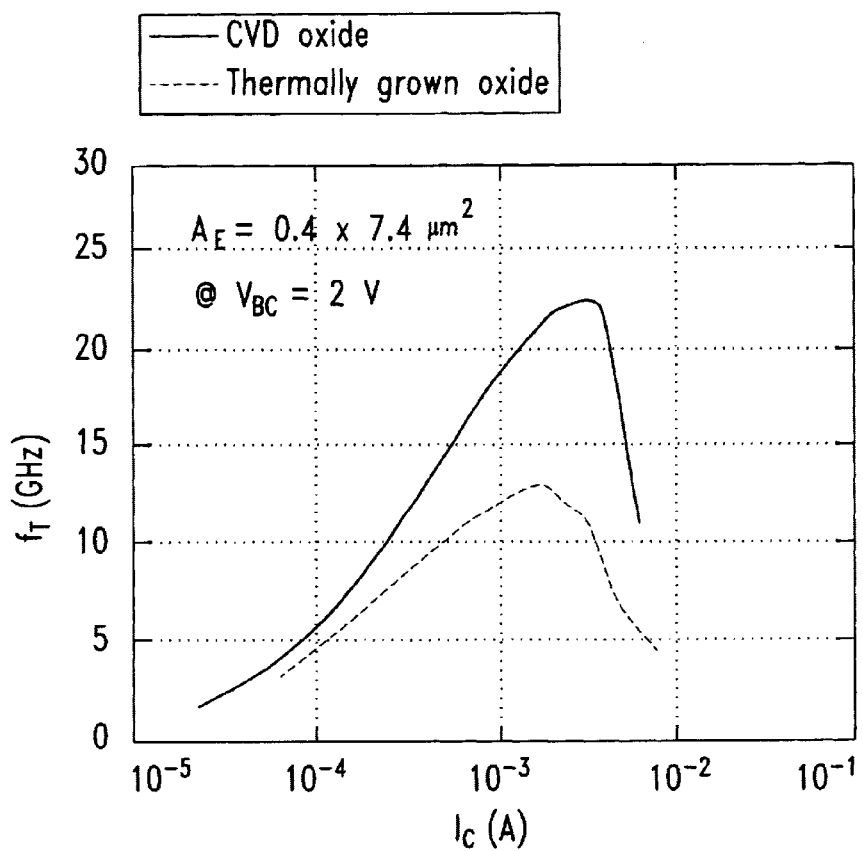
FIG. 14 is a plot of the cut-off frequency versus the collector bias current for two different types of HBT transistors.

A confirmation of the above statements can be found in the graphs of FIG. 13 and FIG. 14 which show, for the two types of HBT transistors described above, the concentration profile of the acceptor impurities versus depth into the substrate and the behavior of the cut-off frequency versus the collector bias current.

Finally, notice that collector bias currents in the milliampere range allow HBT transistors fabricated with the invention process to attain cut-off frequencies in the 20 GHz range, that is hitherto unattainable values.

In conclusion, the fabrication process of this invention allows the frequency field of application of HBT transistors to be further extended, while eliminating deviations of the base current from the ideal.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for fabricating a vertical structure high carrier mobility transistor on a substrate of crystalline silicon doped with impurities of the N type, having a collector region located at a lower portion of the substrate, the process comprising the steps of:

defining a window above the substrate;

providing a first implantation of germanium atoms through said window into the substrate;

providing a second implantation of acceptor dopants through said window to define a base region in the substrate;

applying an RTA treatment, or treatment in an oven, to re-construct a crystal lattice within the semiconductor substrate comprising a silicon/germanium alloy;

forming by chemical vapor deposition a first thin dielectric layer of silicon dioxide on the substrate;

depositing a second dielectric layer onto said first dielectric layer;

depositing a polysilicon layer onto said second dielectric layer;

etching away, within the window region, said first and second dielectric layers, and the polysilicon layer, to expose the base region and form isolation spacers at edges of the window; and forming an N-doped emitter in the base and window regions.

2. The process according to claim 1 wherein the deposition of the first thin dielectric layer of silicon dioxide is carried out by an atmospheric pressure chemical vapor deposition process.

3. The process according to claim 1 wherein the deposition of the first thin dielectric layer of silicon dioxide is followed by thermal treatment.

4. The process according to claim 1 wherein the second dielectric layer is silicon nitride.

5. A process for fabricating a vertical structure high carrier mobility transistor on a substrate of crystalline silicon doped with impurities of the N type, having a collector region located at a lower portion of the substrate, the process comprising the steps of:

defining a window above the substrate;

providing a first implantation of germanium atoms through said window into the substrate;

providing a second implantation of acceptor dopants through said window to defined a base region in the substrate;

applying an RTA treatment to re-construct a crystal lattice within the substrate comprising a silicon/germanium alloy;

forming by chemical vapor deposition a thick dielectric layer of silicon dioxide on the substrate;

depositing a polysilicon layer onto said dielectric layer;

etching away, through the window, said dielectric layer and the polysilicon layer to expose the base region and form isolation spacers at edges of the window; and forming an N-doped emitter in the base and window regions.

6. The process according to claim 5 wherein the deposition of the thick dielectric layer of silicon dioxide is carried out by an atmospheric pressure chemical vapor deposition process.

7. The process according to claim 5 wherein the deposition of the thick dielectric layer of silicon dioxide is followed by thermal treatment.

8. A process for fabricating a vertical structure high carrier mobility transistor on a substrate of crystalline silicon doped with impurities of the N type, having a collector region located at a lower portion of the substrate, the process comprising the steps of:

defining a window above the substrate;

providing a first implantation of germanium atoms through said window into the substrate;

providing a second implantation of acceptor dopants through said window to define a base region in the substrate;

applying an RTA treatment, or treatment in an oven, to re-construct a crystal lattice within the semiconductor substrate comprising a silicon/germanium alloy;

forming a first thin dielectric layer of silicon dioxide on the substrate by deposition of a sacrificial silicon layer, subsequently subjected to a thermal oxidation step;

depositing a second dielectric layer onto said first dielectric layer;

depositing a polysilicon layer onto said second dielectric layer;

etching away, within the window region, said first and second dielectric layers and the polysilicon layer to expose the base region and form isolation spacers at edges of the window; and forming an N-doped emitter in the base and window regions.

9. The process according to claim 8 wherein the formation of the first thin dielectric layer of silicon dioxide is followed by a thermal treatment.

10. The process according to claim 8 wherein the second dielectric layer is silicon nitride.

11. A process for fabricating a vertical structure high carrier mobility transistor on a substrate of crystalline silicon doped with impurities of the N type, having a collector region located at a lower portion of the substrate, the process comprising the steps of:

defining a window above the substrate;

providing a first implantation of germanium atoms through said window into the substrate;

providing a second implantation of acceptor dopants through said window to define a base region in the substrate;

applying an RTA treatment to re-construct a crystal lattice within the semiconductor substrate comprising a silicon/germanium alloy;

forming a thick dielectric layer of silicon dioxide on the substrate by deposition of a sacrificial silicon layer, subsequently subjected to a thermal oxidation step;

depositing a polysilicon layer onto said dielectric layer;

etching away, within the window region, said dielectric layer and the polysilicon layer to expose the base region and form isolation spacers at edges of the window; and forming an N-doped emitter in the base and window regions.

12. The process according to claim 11 wherein the formation of the thick dielectric layer of silicon dioxide is followed by a thermal treatment.

13. A method for manufacturing a heterostructure bipolar transistor having a silicon semiconductor substrate doped with impurities of the first type, comprising:

forming a heterostructure silicon/germanium alloy in the substrate through a window opened over the semiconductor substrate;

forming by chemical vapor deposition a first dielectric layer on the silicon/germanium alloy in the substrate;

etching the first dielectric layer and thereby forming spacers at edges of the window;

forming an emitter region in the substrate through the window; and forming an emitter contact region in contact with the emitter region.

14. The method of claim 13 wherein the step of forming said heterostructure alloy comprises:

depositing a protective layer over the semiconductor substrate;

selectively etching the protective layer to define the window over the substrate;

implanting germanium ions into the substrate through the window;

implanting acceptor dopants through the window to define a base region; and applying a thermal annealing treatment to the substrate including the silicon/germanium alloy.

15. The method of claim 13 wherein the step of forming spacers comprising:

depositing a second dielectric layer onto said first dielectric layer;

depositing a polysilicon layer onto said second dielectric layer; and selectively etching the polysilicon layer, the second dielectric layer, and the first dielectric layer to form the spacers at the window edges.

16. The method of claim 15 wherein the first dielectric layer is silicon dioxide and the second dielectric layer is silicon nitride.

17. The method of claim 13 wherein the step of forming the first thin dielectric layer is accomplished by an atmospheric pressure chemical vapor deposition process.

18. The method of claim 13 wherein the step of forming the first dielectric layer is followed by a thermal treatment.

19. The method of claim 13 wherein the step of forming the first dielectric layer includes:

depositing a sacrificial silicon layer on the substrate through the window; and forming the first dielectric layer of silicon dioxide over the substrate by subjecting the sacrificial silicon layer to a thermal oxidation process.

* * * * *